(12) United States Patent
Knaipp et al.

(10) Patent No.: US 8,212,318 B2
(45) Date of Patent: Jul. 3, 2012

(54) HIGH-VOLTAGE TRANSISTOR WITH IMPROVED HIGH STRIDE PERFORMANCE

(75) Inventors: Martin Knaipp, Unterpremstätten (AT); Georg Röhrer, Graz (AT); Jong Mun Park, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 297 days.

(21) Appl. No.: 12/299,741

(22) PCT Filed: Apr. 16, 2007

(86) PCT No.: PCT/EP2007/003338
§ 371 (c)(1), (2), (4) Date: Apr. 20, 2009

(87) PCT Pub. No.: WO2007/128383
PCT Pub. Date: Nov. 15, 2007

(65) Prior Publication Data
US 2009/0321822 A1    Dec. 31, 2009

(30) Foreign Application Priority Data
May 5, 2006  (EP) ................................. 06009366

(51) Int. Cl.
*H01L 29/66* (2006.01)

(52) U.S. Cl. ................ 257/341; 257/E29.017

(58) Field of Classification Search ............... 257/342, 257/345, 492, 493, E29.012, E29.017, E29.066, 257/E29.256, 213, 288, 327, 336, 337, 339, 257/340, 341, 343
See application file for complete search history.

(56) References Cited

U.S. PATENT DOCUMENTS

| | | | | |
|---|---|---|---|---|
| 4,626,879 A | * | 12/1986 | Colak | ........................ 257/336 |
| 5,595,921 A | * | 1/1997 | Villa et al. | .................... 438/286 |
| 6,903,421 B1 | | 6/2005 | Huang et al. | |
| 2002/0050613 A1 | * | 5/2002 | Rumennik et al. | ........... 257/325 |
| 2004/0108544 A1 | | 6/2004 | Hossain et al. | |
| 2005/0184338 A1 | * | 8/2005 | Huang et al. | ................. 257/335 |
| 2007/0013022 A1 | * | 1/2007 | Shimizu | ........................ 257/500 |
| 2007/0278570 A1 | * | 12/2007 | Knaipp et al. | ................ 257/339 |

FOREIGN PATENT DOCUMENTS

| | | |
|---|---|---|
| DE | 10 2004 014 928 | 10/2005 |
| JP | 57 180164 | 11/1982 |
| JP | 05-121738 | 5/1993 |
| WO | WO 2005/083794 | 9/2005 |

OTHER PUBLICATIONS

P. Hower et al. "Using "Adaptive Resurf" to Improve SOA of Ldmos Transistors", ISPSD 2000, Proceedings, pp. 345-348, May 22, 2000, XP000987884.

\* cited by examiner

*Primary Examiner* — Ha Tran T Nguyen
*Assistant Examiner* — Vongsavanh Sengdara
(74) *Attorney, Agent, or Firm* — Cozen O'Connor

(57) ABSTRACT

A high voltage NMOS transistor is disclosed where the p-doped body is isolated against the p-doped substrate by a DN well having a pinch-off region where the depth of the DN-well is at minimum. By the forming space charge region at raising drain potentials a shielding of the drain potential results because the space charge region touches the field oxide between source and drain at the pinch-off region. An operation at the high side at enhanced voltage levels is possible.

11 Claims, 4 Drawing Sheets

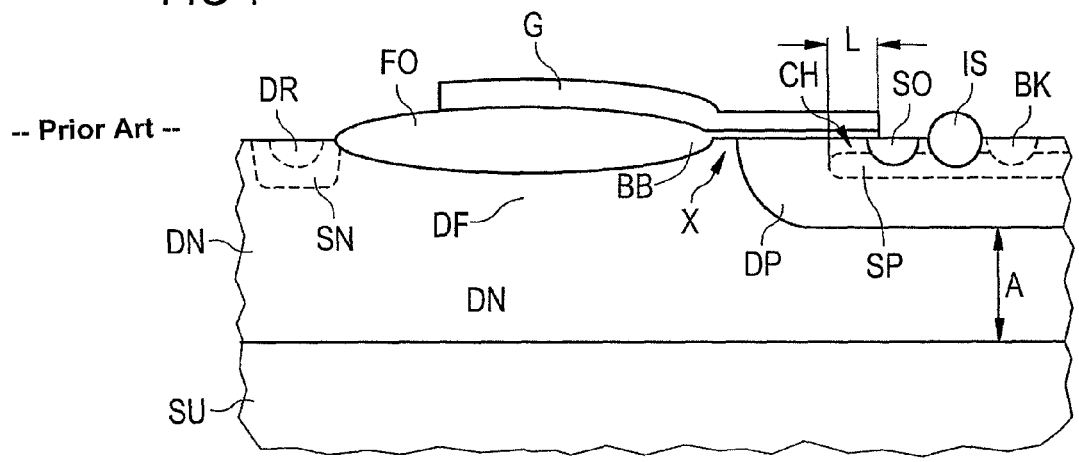
FIG 1 -- Prior Art --
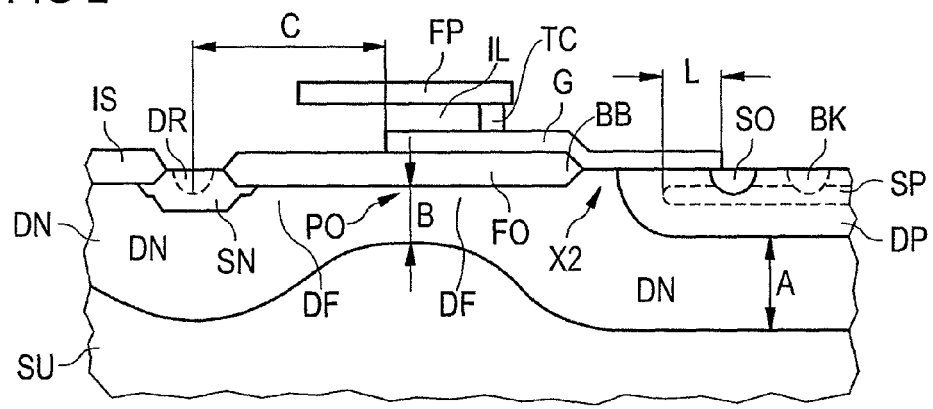
FIG 2

HIGH-VOLTAGE TRANSISTOR WITH IMPROVED HIGH STRIDE PERFORMANCE

RELATED APPLICATIONS

This is a U.S. national stage under 35 USC §371 of application No. PCT/EP2007/003338, filed on Apr. 16, 2007.

This application claims the priority of European application no. 06009366.3 filed May 5, 2006, the entire content of which is hereby incorporated by reference.

FIELD OF THE INVENTION

The present invention involves a high voltage transistor of the NMOS type.

BACKGROUND OF THE INVENTION

Nowadays silicon systems like micro-electrical-mechanical systems (MEMS), electroluminescent lamps or piezo amplifiers for example have handling voltages in the range of 100-150V. For switching these devices HV (high voltage) NMOSFET transistors can be used which are able to switch on the high side near VDD thereby avoiding parasitic drain/substrate current.

To allow large potential drops inside doped transistor regions a low doped epitaxial layer with large thickness is needed which makes this technology expensive.

To overcome this disadvantage and to reduce the device depth from the silicon surface, a careful design of the used wells must ensure that the electrical fields in the sensitive parts of the device are reduced, the device thereby staying compatible with the existing low voltage logic. These sensitive locations are in the area of the bird's beak (see BB in FIGS. 1 and 2) of the field oxide being arranged between source and drain regions, the area below the body well and near the corners of the device ($3^{rd}$ dimension). The key point for high side operation is to isolate the device channel from the p-doped substrate. Usually this is done by placing the body well inside an n-doped well. In general the distance between the body well and the substrate determines the isolation of the channel to the substrate. In addition a large such distance allows to bias source and body below or above substrate potential and reduces the beta parameter of the parasitic bipolar pnp transistor comprising p-body, DN well and p-doped substrate.

Normally the DN well used to situate the body therein is generated by a high temperature drive in step. This results in a typical well profile which has the highest concentration of doping and therefore the steepest body/DN junction close to the silicon surface.

SUMMARY OF THE INVENTION

It is an object of the invention to provide a high voltage NMOS transistor being able to be switched on the high side and having a reliable operating characteristic over a broad range of operating voltages up to 150V and more.

This and other objects are attained in accordance with one aspect of the present invention directed to a high voltage NMOS type, comprising a substrate, a deep DN well produced near the surface of the substrate, highly n-doped source and drain arranged in the DN well, a field oxide region or a shallow trench region situated on the surface of the DN well between source and drain, a p-doped channel region being situated between the field oxide region and the source, a gate, partly covering that field oxide region and the channel region.

The DN well comprises a pinch off region located under the field oxide region near a point representing the middle point of the distance between the both edges of the field oxide region facing to source and drain respectively. The depth of the DN well is at a minimum value in said pinch off region.

Said pinch off region splits the drift region (see DF in FIGS. 1 and 2) of the transistor in two separated drift zones. The first zone is around the drain contact. In this zone, the S/D voltage has the largest part of the voltage drop. The n-type drift region comprised in the DN well of the transistor is pinched off near the middle of the field oxide region. This is because the space charge building up at a high drain potential at the drain touches the field oxide where the distance between the field oxide and the pn junction is at a minimum. Thus, the information of the high drain potential cannot reach the channel region. In the same way as an applied potential drops within the specified region, also any effect of an increase of the potential must be totally cancelled or removed in the drain part of the drift region. As the second zone of the drift region and the channel see only a relative small voltage drop independent from the rising drain potential, the electric field strength in the before-mentioned critical point in the channel region near the bird's beak of the field oxide region is fixed to a maximum value which is well below the breakdown value and independent of the drain potential. The concept is valid for very high S/D voltages in a range up to 100-200V.

The DN well of the transistor comprises two parts, the first part being situated in the source region and the second in the drain region. The two parts overlap in the pinch off region, the depth of the DN well being smaller in the overlap than in the centre of the two parts at the source and the drain region respectively.

By the pinch off of the drift region while operating the transistor at high side when the voltage VDS between source and drain is near zero the conductivity of the drift region in the pinch off region is reduced. To overcome this further improvements are proposed.

A flat SN well can be situated near the surface of the substrate in the pinch off region thereby enhancing the n-doping concentration of the DN well. As a result the conductivity in this area is enhanced reducing the on-resistance of the transistor. While producing the flat SN well by a n-implant using a resist mask having a in the region desired for the SN well the dimension and location of this window can be used as a layout parameter optimize the transistor to get the best performance.

Spaced apart from the edge of the field oxide a deep DP well can be arranged under the source. In the DP well a shallow SP well can situated providing a gradient of the p-doping concentration rising from the surface to the SP well. The source extends into the shallow SP well.

Between the deep DP well and the adjacent edge of the field oxide region forming a bird's beak there, a deep DP buffer well region can be produced. This buffer well has its highest p-doping concentration in its centre which is spaced apart from the surface of the substrate. By diffusing the dopants of the DP buffer well the doping concentration is reduced in the neighbourhood of the buffer well helping to reduce the field strength in this critical point and therefore the breakdown voltage is raised.

Under the gate electrons are accumulated near the surface of the substrate in the drift zone by the gate potential in the on-state of the transistor. To enhance the conductivity of the drift zone in the pinch off point area the gate should extend from the channel region up to at least the pinch off point and advantageously a bit beyond this point.

A field plate can be arranged in a first metallization plane separated from the surface of the substrate and the gate by a isolating layer. The field plate is structured from the first metallization plane and electrically connected to the gate poly electrode by via. It is arranged above the second drift zone and overlaps the gate poly partially. Therewith the electrical field in the second drift region is reduced because the potential drops more in the oxide above the second drift region.

The transistor constructed as explained above has a breakdown voltage of at least 150V and may be up to at least 200V. Thus the transistor may be used to switch devices operating with voltages up to said values. In case the operation is on the high side the substrate potential can be much lower compared to the source potential. Thus, the transistor is compatible to a large number of other devices which need other operating voltages.

BRIEF DESCRIPTION OF THE DRAWINGS

FIG. 1 shows a prior art HV NMOS transistor,
FIG. 2 shows an isolated HV NMOS transistor with pinch off.

DETAILED DESCRIPTION OF THE DRAWINGS

Figure 3:
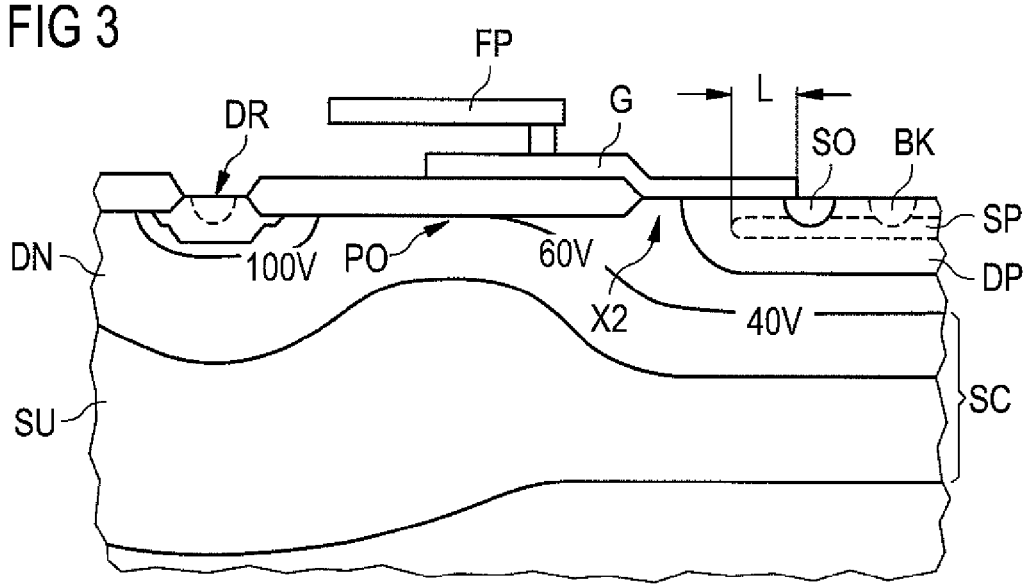
FIG. 3 shows the transistor of FIG. 2 with space charge region.

FIG. 1 shows an exemplary structure of a prior art HV NMOS transistor used to operate on the high side. Typically the p-doped body of the transistor is placed in a deep n-doped well DN of the DN type generated by a high temperature drive in step into a p-doped substrate SU. The body comprises a deep p-doped body well DP wherein a reverse shallow p well SP is situated. The transistor also has a drain DR, field oxide FO, gate G, and channel region CH.

The critical parameters of this structure are the distance A between the body well DP and the substrate SU. The break down regions with the highest potential drop is designated by X and situated near the surface of the semiconductor body at the boundary of the DP body well and the DN well. In general the distance A should be as large as possible to allow good channel isolation, an enhanced high side switching voltage and a low beta parameter of the parasitic vertical PNP bipolar transistor. In addition a large distance A allows to bias source and body below substrate (off-current state). This is important for reverse polarity specifications. The maximum body/p-substrate voltage is equal to the maximum drain/p-substrate voltage also requiring a large distance A. Only in this case the device can work as a high side switch over the full S/D voltage range. A low beta parameter of the parasitic vertical PNP bipolar transistor is important to avoid substrate currents caused by inductive loads in case the body to drain voltage gets positive.

The typical drain profile of the DN well in the known transistor of FIG. 1 has the highest concentration and therefore the steepest body/DN junction close to the silicon surface at point X. In case of reverse polarity ($VD=V_{Substrate}>V_{Body}=VS$) this breakdown point is shifted to the area below the source SO and body contact BK, which are separated by an insulation region IS, because of the missing space charge region in this case. The DP well works like a buffer layer to avoid a breakdown between the "channel well" SP, which defines the channel length L, and the DN well. Using a realistic dose for implanting the DN well and drive temperature and time, the device of FIG. 1 is limited to a blocking and high side voltage well below 100 V.

FIG. 2 shows the structure of a transistor device in accordance with an embodiment of the invention. Here, the deep N well DN has a pinch off PO where the distance B between field oxide FO and substrate SU is at minimum. The maximum depth of the DN well is situated below drain DR and deep P body well DP to allow a sufficient distance A between body well DP and substrate SU. The remaining structure elements are as usual. Drain DR is situated in a shallow n-doped N well SN. The gate G is made of polysilicon and extends from the source SO to the middle of the field oxide region FO separating the source and drain regions. The process concept to separate the field plates from the drift region can be done via a field oxidation or a shallow trench oxidation. A further detail of the new structure is the field plate FP arranged above the gate G in the first metallization plane. The gate G extends at least to the pinch off PO with the minimum distance B thereby forming a device parameter C which is the distance between the drain DR and the edge of the gate at the drain side. The field plate FP extends beyond the drain side edge of the gate. The source side edge of the field plate is situated in that way that a contact connection of the first metallization plane to poly is possible. The field plate FP is separated from the surface of the substrate and the gate by an isolating layer IL and electrically connected to the gate by a through contact TC or a via.

FIG. 3 shows the effect of the disclosed structure under high voltage. In case all terminals are at ground potential and the drain potential rises the space charge region SC builds up between substrate and deep p-well DP. At a certain drain voltage $V_{pinch}$, the space charge region SC touches the field oxide region FO in the point of the smallest distance B. Each additional drain potential now drops in the drain part of the device between drain DR and point PO. The drain potential is thus shielded by the space charge region. This results in a field limitation at point X2 and a higher breakdown voltage. With this structure a small on-resistance of the transistor (= resistance in the switched-on state) can be derived with source voltages below $V_{pinch}$. At source voltages above the potential at the pinch off point PO the on-current is reduced. The barrier is caused by the substrate potential which defines the potential near the smallest distance B.

Figure 5:
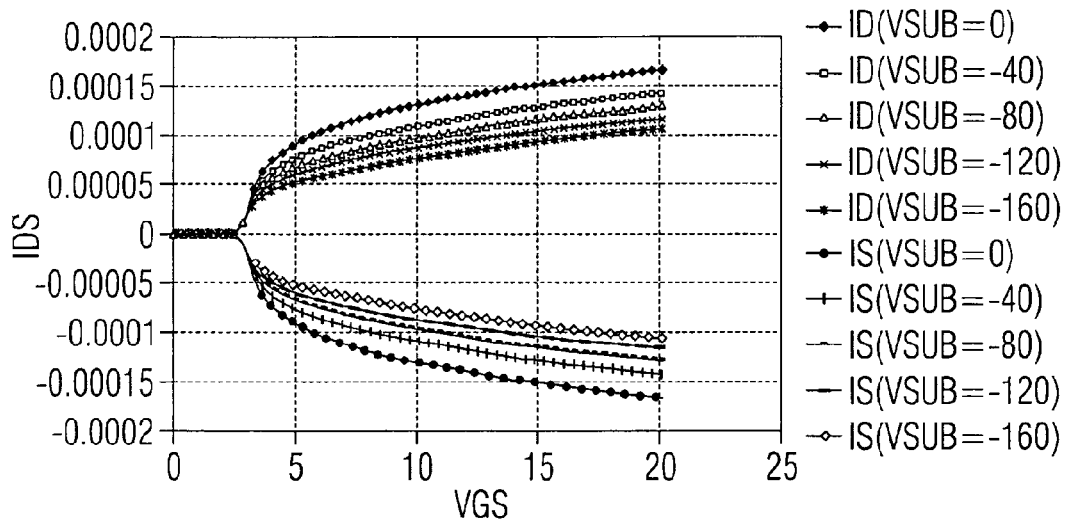
FIG. 5 shows the transfer curves of the transistor at different substrate potentials for transistor current IDS and voltage VDS between source and drain.

FIG. 5 shows typical transfer curves at different substrate potentials. In FIG. 5, I is current, V is voltage, D is drain, G is gate, S is source, SUB is substrate, IDS is the drain-source current, and VGS is the gate-source voltage. It can be seen that the on-resistance strongly depends on the high side voltage (which is about VDD in the device) and gets higher in case VDD increases. The blocking voltage (where $V_s=V_B=V_{sub}=0V$) measured in the device of FIGS. 2 and 3 is about 155V.

Figure 4:
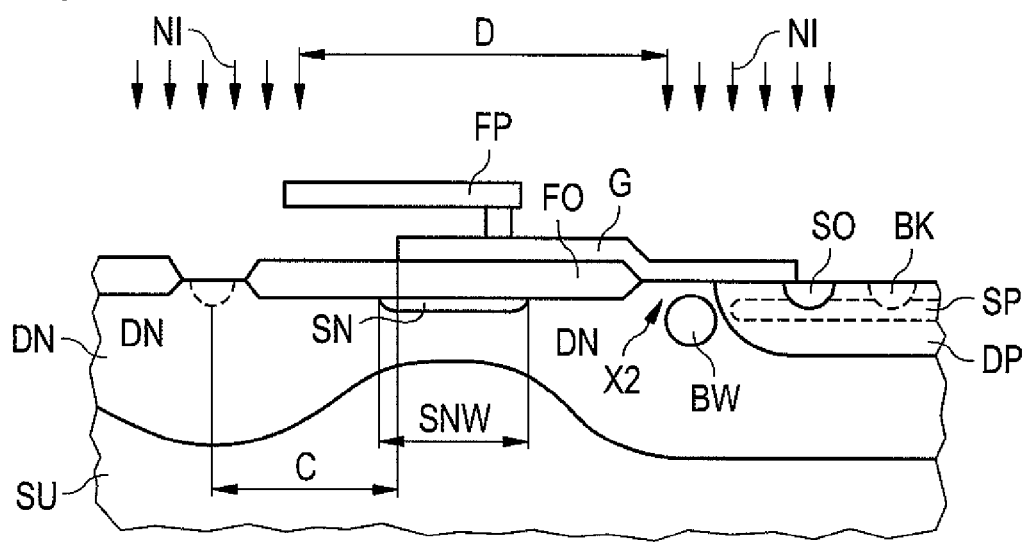
FIG. 4 shows a further improved transistor according to an embodiment of the invention.

Further improvements of the proposed transistor are indicated in FIG. 4. The poly gate G can help to accumulate the electrons in the drift region and to carry them over the pinch-off point PO. This is especially useful for devices which allow a large VGS. To optimize these devices the gate poly can be drawn close to the pinch-off point PO. The layout parameter C can be optimized to get the best performance. In case the gate poly is close to the pinch-off point, one can imagine the transistor as a series circuit of two high voltage transistors. The first transistor includes the regular channel, the bird's beak and the first part of the drift region (until the pinch-off point PO). The drift region of the second transistor starts at the pinch-off point. The channel of the second transistor is the drift region of the first transistor which works like a parasitic field transistor.

The deep DN well is produced by an implant NI of n-dopants through an implant mask having an implant resist area with the length D. Distance D should be as small as possible thereby enlarging distance B to the optimum value. The shallow region of the deep N well DN is formed by shielding the implantation in the region of the pinch-off point PO. If the distance D is small, the masked or shielded area is confined to a correspondingly small region. In the vicinity of the pinch-off point PO more n-dopants are implanted than in the case of a larger distance D, resulting in a higher concentration of dopants and a deeper doping profile. The narrowing of the shallow region will be less pronounced, and the dimension B shown in FIG. 2 will be larger. A greater distance B reduces the breakdown voltage. This gives the lowest drift resistance in the point X2 and therefore the lowest on-resistance. Unfortunately the electric field strength rises at the bird's beak in case D gets smaller. To control the process conditions more accurately a dedicated SN implant is applied in the pinch off point PO. This reduces the influence of the DN well dose variations. The SN implant window is a layout parameter SNW which is to be optimized to get the best performance.

The breakdown voltage near the bird's beak should be as high as possible. A deep p-doped buffer well BW implanted between channel region and the source side edge of the field oxide region helps to reduce the field strength in this point and therefore raises the breakdown voltage. The buffer well BW counterdopes the DN well around the bird's beak. Thus, the space charge region is enhanced but has a smaller field strength. The buffer well can touch the surface but has a dopant concentration below the dopant concentration in the channel CH. With the buffer well the distance B can be enlarged and vice versa a distance B chosen sufficiently large needs a buffer well BW.

Figure 6:
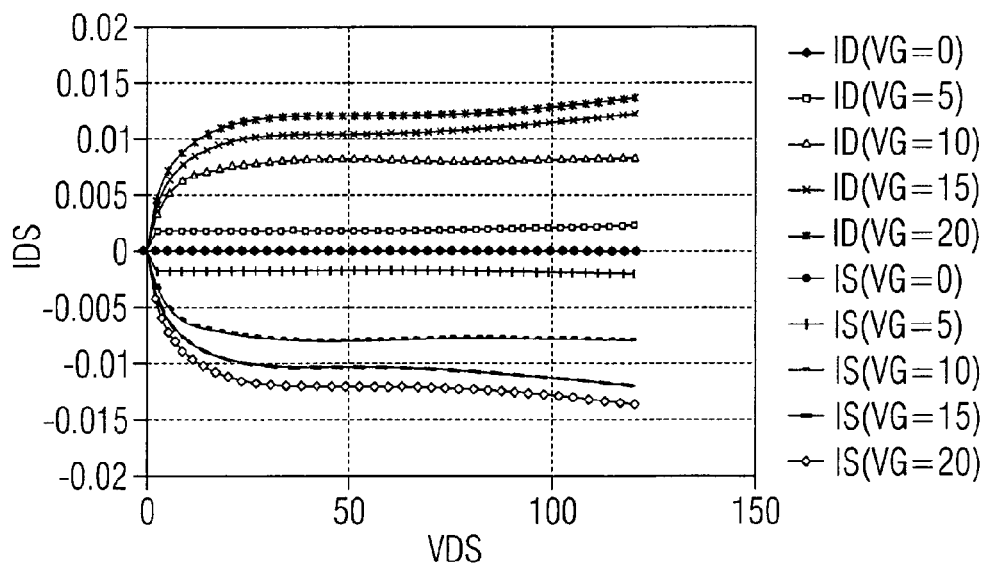
FIG. 6 shows the typical output curves of the transistor at different gate voltages potentials for transistor current IDS and voltage VDS between source and drain.

FIG. 6 shows the high side switching capability of a typical transistor constructed according to the invention. The curves are characterised by steep rise of the transistor current IDS (drain-source current) depicted as function of VDS (drain-source voltage). At rising VDS the on-current IDS is constant up to high voltages of 150 to 200 V before breakdown occurs. The switching capability is demonstrated for gate voltages from 5 to 20 V making the device useful for being switched by small voltages of a CMOS logic device connected to the gate.

Figure 7:
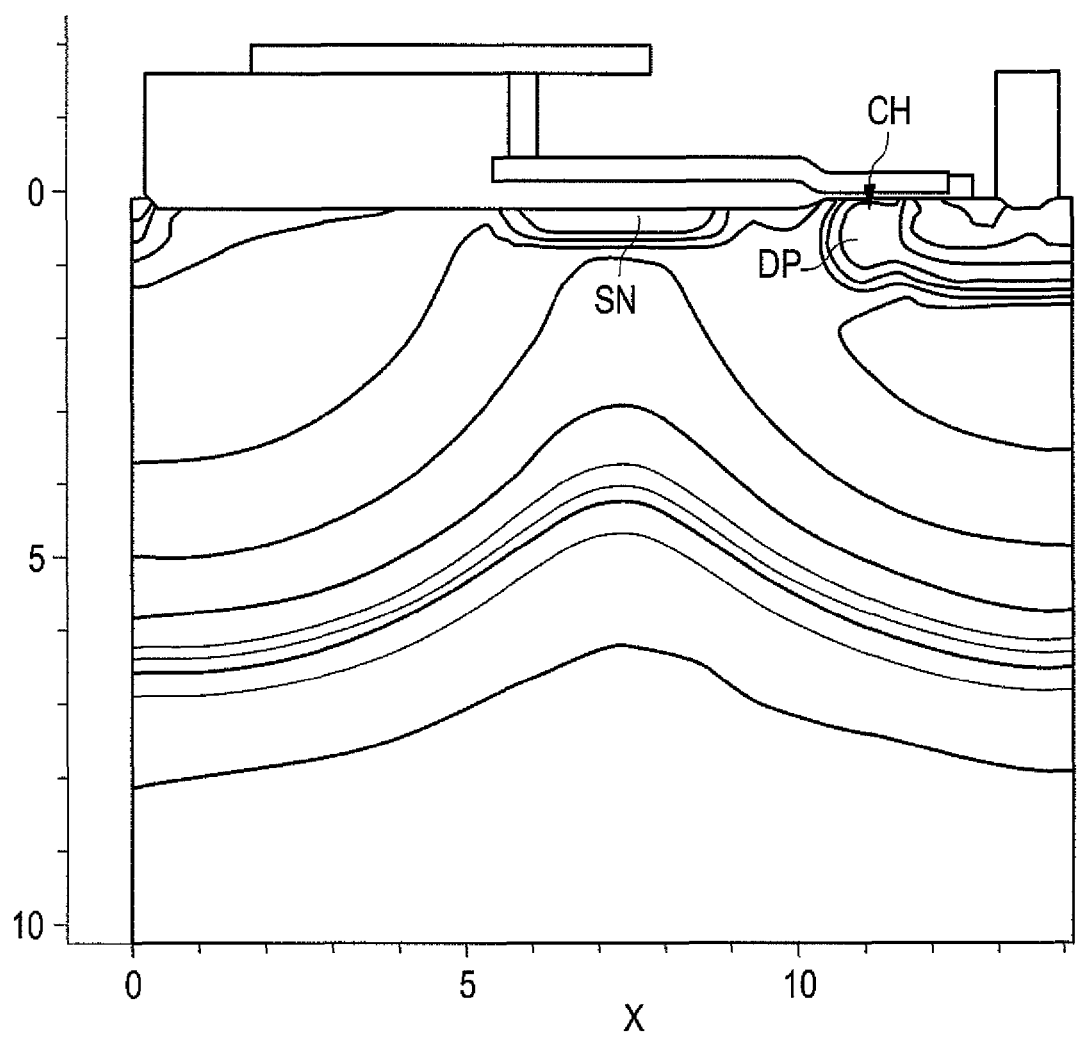
FIG. 7 shows the simulated net doping profile of an optimized embodiment according to FIG. 4.

FIG. 7 shows the simulated net doping profile of an optimized embodiment according to FIG. 4.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A high voltage NMOS transistor, comprising:
    a substrate having a surface;
    a deep n-well arranged near the surface of the substrate;
    a body which is isolated from the substrate via the deep n well;
    an n-doped source and drain arranged in the deep n well;
    a field oxide or a shallow trench region situated on the surface of the deep n-well between said n-doped source and drain;
    a p-doped channel region situated between the field oxide or shallow trench region and the n-doped source; and
    a gate partly covering said field oxide or shallow trench region and the p-doped channel region;
    wherein the deep n-well comprises a pinch-off region located under a middle of the field oxide or shallow trench region;
    wherein a depth of the deep n-well varies in the pinch off region;
    wherein a height of the substrate is greatest at the middle of the field oxide or shallow trench region and is greater than near the n-doped source and drain; and
    wherein the gate extends over the pinch-off region.

2. The transistor of claim 1, wherein the deep n well is divided into two parts, a first part of the two parts being situated in the n-doped source region and a second part of the two parts being situated in a drain region, the two parts overlapping in the pinch-off region, and the depth of the deep n-well in the overlap being smaller than the depth at the n-doped source region and the drain region, respectively.

3. The transistor of claim 1, wherein a flat n-well is situated near the surface of the substrate in the pinch off region enhancing the n-doping concentration of the deep n-well.

4. The transistor according to claim 1, wherein a deep p-well is situated under the n-doped source spaced apart from the field oxide or shallow trench region.

5. The transistor of claim 4, wherein a shallow p well is situated in the deep p-well and provides a gradient of a p-doping concentration rising from the surface of the substrate to the shallow p-well.

6. The transistor according to claim 4, wherein a deep buffer well region is situated between the deep p-well and the field oxide or shallow trench region, the deep buffer well region having a higher p doping concentration in its center which is spaced apart from the surface of the substrate.

7. The transistor according to claim 5, wherein the n-doped source is placed in the shallow p-well.

8. The transistor according to claim 1, further comprising:
    a field plate structured in a first metallization plane separated from the surface of the substrate and the gate by an isolating layer and electrically connected to the gate by a through contact;
    wherein the field plate extends from the middle of the field oxide or shallow trench region to an edge of the field oxide or shallow trench region facing to the drain, and overlapping the gate.

9. The transistor according to claim 1, wherein the transistor has a breakdown voltage of at least 150V.

10. The transistor according to claim 1, wherein the transistor has a breakdown voltage of 0-200V.

11. The transistor according to claim 1, wherein the gate and the field oxide or shallow trench region, respectively, have an edge facing the drain, said edge of the gate being situated between said edge of the field oxide or shallow trench region and a point located above the pinch-off region where the deep n-well has a minimum depth.

* * * * *